Figure 1:
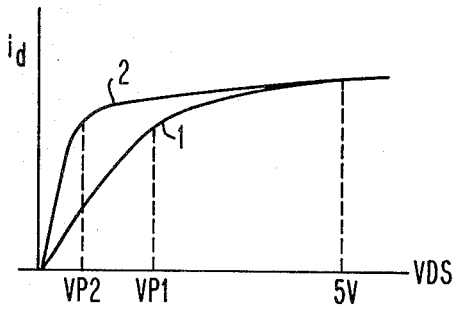
Figure 2:
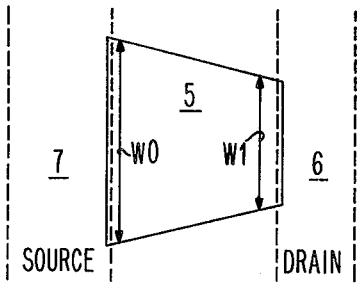
Figure 3:
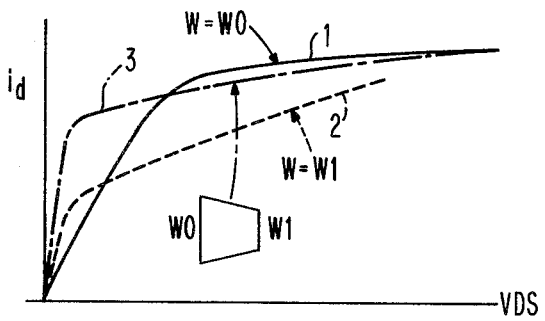
Figure 4:
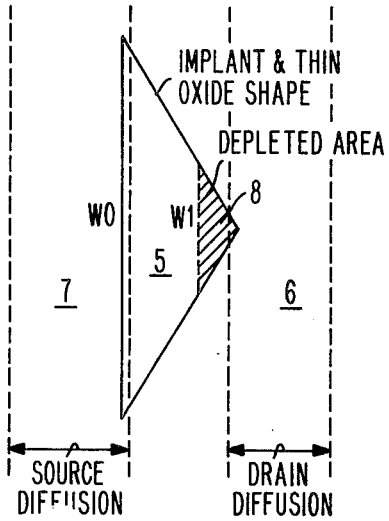
Figure 5:
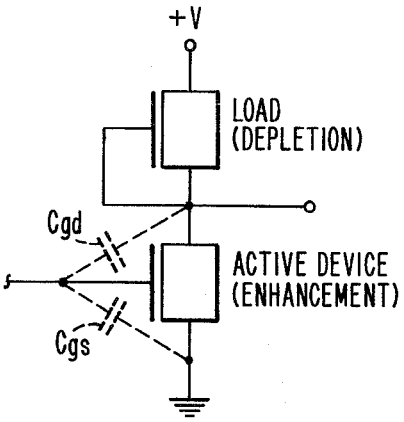
Figure 6:
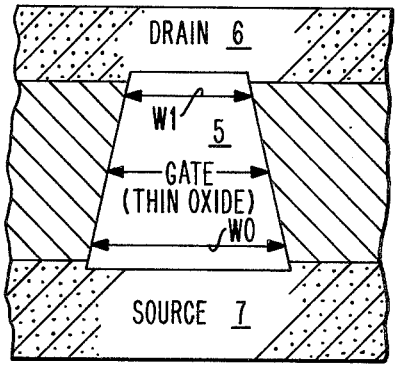

United States Defensive Publication [19] (H) [11] T979,006

Hadamard, deceased et al. [43] Feb. 6, 1979

[54] TRAPEZOIDAL GATE FET DEVICE

[76] Inventors: Gilbert Hadamard, deceased, late of Manassas, Va., by Denise L. Hadamard, administratrix, Chemin de la Belloire, St. Jeannet, France

[21] Appl. No.: 920,026

[22] Filed: Jun. 28, 1978

Related U.S. Application Data

[63] Continuation of Ser. No. 760,806, Jan. 19, 1977, abandoned.

[51] Int. Cl.[2] ..... H01L 29/78

[52] U.S. Cl. ..... 357/23; 357/42; 357/68

[57] ABSTRACT

A trapezoidal shaped FET gate structure is disclosed, having a small end juxtaposed with the drain of the device, to reduce the gate-to-drain capacitance and the Miller effect in an active device or to reduce the pinch-off voltage in an FET load device.

1 Claim, 1 Sheet Drawing,

13 Pages Specification

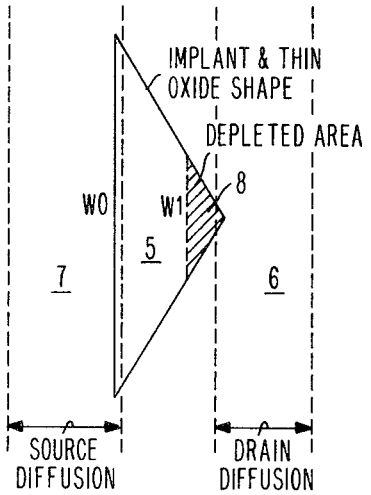

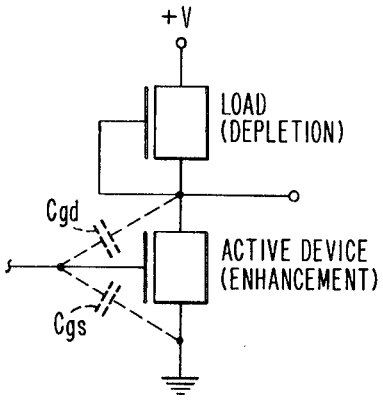

The file of this unexamined application may be inspected and copies thereof may be purchased (849 O.G. 1221, Apr. 9, 1968).